US011393775B2

(12) United States Patent
Hsieh et al.

(10) Patent No.: US 11,393,775 B2
(45) Date of Patent: Jul. 19, 2022

(54) SEMICONDUCTOR DEVICE PACKAGE

(71) Applicant: Advanced Semiconductor Engineering, Inc., Kaohsiung (TW)

(72) Inventors: Ming-Wei Hsieh, Kaohsiung (TW); Ming-Tau Huang, Kaohsiung (TW); Yu-Chih Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/112,930

(22) Filed: Dec. 4, 2020

(65) Prior Publication Data

US 2022/0181277 A1 Jun. 9, 2022

(51) Int. Cl.

| | |
|---|---|
| ***H01L 23/64*** | (2006.01) |
| ***H01L 23/31*** | (2006.01) |
| ***H01L 49/02*** | (2006.01) |
| ***H01L 21/56*** | (2006.01) |

(52) U.S. Cl.

CPC .......... *H01L 23/642* (2013.01); *H01L 21/565* (2013.01); *H01L 23/315* (2013.01); *H01L 28/75* (2013.01)

(58) Field of Classification Search

CPC ... H01L 23/642; H01L 23/315; H01L 21/565; H01L 28/75

See application file for complete search history.

(56) References Cited

U.S. PATENT DOCUMENTS

| | | | | |
|---|---|---|---|---|
| 4,598,307 | A * | 7/1986 | Wakabayashi | H01L 23/495 174/539 |
| 5,387,814 | A * | 2/1995 | Baudouin | H01L 23/49589 257/690 |
| 2018/0315719 | A1 | 11/2018 | Kim et al. | |
| 2019/0333866 | A1 * | 10/2019 | Tsukuda | H01L 23/49531 |

* cited by examiner

*Primary Examiner* — Peniel M Gumedzoe

(74) *Attorney, Agent, or Firm* — Foley & Lardner LLP

(57) ABSTRACT

The present disclosure provides a semiconductor a semiconductor device package includes a substrate, an electronic component disposed on the substrate, a package body disposed on the substrate and encapsulating the electronic component, and a capacitor disposed above the electronic component. The capacitor is exposed from the package body.

11 Claims, 16 Drawing Sheets

3

SEMICONDUCTOR DEVICE PACKAGE

BACKGROUND

1. Technical Field

The present disclosure generally relates to a semiconductor device package and method of manufacturing a semiconductor device package.

2. Description of the Related Art

A decoupling capacitor is commonly used in a semiconductor device package to decouple one part of an electrical network (circuit) from another, such as to reduce parasitic inductance, reduce impedance and increase resonance frequency of the entire package.

In an existing process, a preformed decoupling capacitor (which has a predefined capacitance) may be disposed on an electronic component and connected to ground domain and power domain via wires, and then a molding operation is carried out to encapsulate the preformed decoupling capacitor with the electronic component.

However, in such process, many factors (such as variation resulting from manufacturing process, component position, wire length, and material characteristics) would cause deviation from the predefined capacitance, and thus degrade the performance of the preformed decoupling capacitor.

SUMMARY

In some embodiments, a semiconductor device package includes a substrate, an electronic component disposed on the substrate, a package body disposed on the substrate and encapsulating the electronic component, and a capacitor disposed above the electronic component. The capacitor is exposed from the package body.

In some embodiments, a semiconductor device package includes a substrate, an electronic component disposed on the substrate, and a package body disposed on the substrate and encapsulating the electronic component. The package body defines a cavity recessed from a top surface of the package body. The semiconductor device package also includes a capacitor disposed in the cavity of the package body.

In some embodiments, a method for manufacturing a semiconductor device package includes providing a package body with a cavity on a top surface of the package body. The package body encapsulates an electronic component on a substrate. The method also includes forming a capacitor with a predetermined capacitance in the cavity of the package body.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
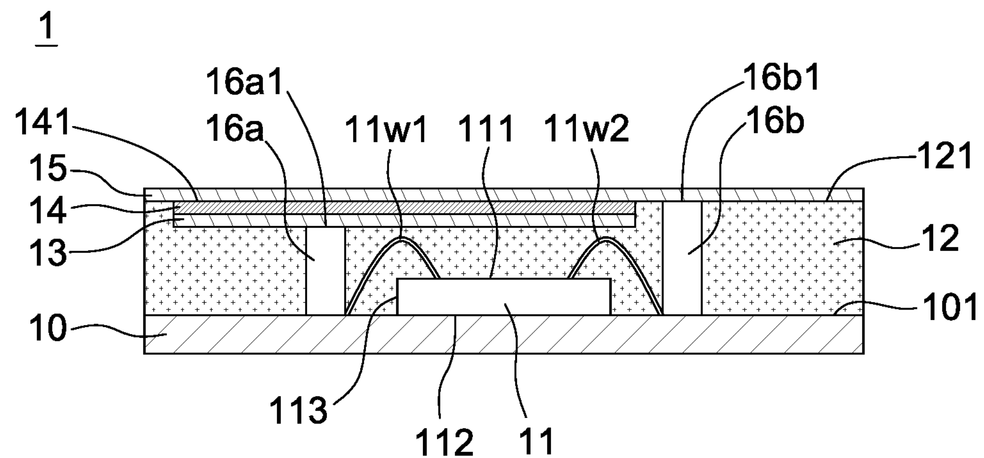
FIG. 1A illustrates a cross sectional view of an exemplary semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, a reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross sectional view of an exemplary semiconductor device package 1 in accordance with some embodiments of the present disclosure. In some arrangements, the semiconductor device package 1 includes a substrate 10, an electronic component 11, a package body 12, and a capacitor (e.g., a decoupling capacitor). In some embodiments, the capacitor includes multiple portions, including a conductive layer 13, a dielectric layer 14, and a conductive layer 15 as shown.

The substrate 10 may include, for example, a printed circuit board, such as a paper-based copper foil laminate, a composite copper foil laminate, a polymer-impregnated glass-fiber-based copper foil laminate, or so on. The substrate 10 may include one or more interconnection structures, such as a redistribution layer (RDL) or a grounding element. The interconnection structures may include, for example, one or more conductive pads proximate to, adjacent to, or embedded in and exposed from a surface 101 of the substrate 10 facing the electronic component 11.

The electronic component 11 may include, for example, a chip or a die. The chip or a die may include a semiconductor substrate (e.g., silicon substrate), one or more integrated circuit (IC) devices, and one or more interconnection structures therein. In some examples, the IC devices may include an active component, such as an IC chip or a die. In some examples, the IC devices may include a passive electronic component, such as a capacitor, a resistor, or an inductor.

The electronic component 11 includes a surface 111, a surface 112 opposite to the surface 111, and a lateral surface 113 extending between the surface 111 and the surface 112. In some examples, the surface 111 is an active surface and the surface 112 is a passive surface or a backside surface. In some examples, the surface 111 may include analog or digital circuits (implemented as active devices, or passive devices) formed within the electronic component 11 and electrically interconnected according to the electrical design and function of the electronic component 11. One or more electrical contacts may be in proximity to, adjacent to, or embedded in and exposed from the surface 111.

The electronic component 11 is disposed or installed on the substrate 10. The electronic component 11 may be electrically connected to the substrate 10 by, for example, flip-chip or wire-bonding. In the examples in which the electronic component 11 is electrically connected to the substrate 10 by wire-bonding, the surface 111 of the electronic component 11 faces away from the substrate 10, and one or more conductive wires (e.g., conductive wires 11*w*1 and 11*w*2) electrically connect the surface 111 of the electronic component 11 with the one or more interconnection structures (e.g., a RDL) in the substrate 10. In some examples, one of the conductive wires 11*w*1 and 11*w*2 may be connected to ground domain and another one may be connected to power domain.

The package body 12 is formed on the surface 101 of the substrate 10 to encapsulate the electronic component 11. The electronic component 11 is embedded in the package body 12. For example, the package body 12 covers the surface 111 of the electronic component 11 and surrounds the lateral surface 113 of the electronic component 11.

In some embodiments, the package body 12 may include, for example, an epoxy resin having fillers, a molding compound (e.g., an epoxy molding compound or other molding compound), a polyimide, a phenolic compound or material, a material with a silicone dispersed therein, or a combination thereof.

In some examples, one or more conductive pillars (e.g., conductive pillars 16*a* and 16*b*) penetrate through the package body 12. For examples, the conductive pillars 16*a* and 16*b* penetrate from a surface 121 of the package body 12 to a surface of the package body 12 opposite to the surface 121. In some examples, the surface 121 of the package body 12 is an outermost, uppermost, or top surface of the package body 12 and faces away the substrate 10. In some embodiments, the conductive pillars 16*a* and 16*b* are disposed adjacent to the electronic component 11. In some embodiments, the conductive pillars 16*a* and 16*b* are spaced apart from the electronic component 11. In some examples, a projective area of the conductive pillar 16*a* (or the conductive pillar 16*b*) on the substrate 10 is spaced apart from a projective area of the electronic component 11 on the substrate 10. In the present disclosure, a projective area on the substrate 10 may refer to a projective area on the surface 101 of the substrate 10.

In some examples, the conductive pillar 16*a* is in contact with the substrate 10 and the conductive layer 13. In some examples, the conductive pillar 16*a* is disposed between the substrate 10 and the conductive layer 13. In some examples, the conductive pillar 16*b* is in contact with the substrate 10 and the conductive layer 15. In some examples, the conductive pillar 16*b* is disposed between the substrate 10 and the conductive layer 15.

The conductive pillars 16*a* and 16*b* are embedded in the package body 12. For example, the package body 12 surrounds the conductive pillars 16*a* and 16*b*. In some examples, the package body 12 covers the entire surfaces of the conductive pillars 16*a* and 16*b* except for the portions configured to electrically connect the electronic component 11 to the conductive layers 13 and 15 of the capacitor.

For example, a portion of the conductive pillar 16*a* and 16*b* is exposed from the package body 12 to electrically connect to the conductive wires 11*w*1 and 11*w*2. As shown in FIG. 1A, the conductive wires 11*w*1 and 11*w*2 are physically in contact with a portion of the sidewalls of the conductive pillars 16*a* and 16*b*, respectively. For example, a portion of the conductive pillar 16*a* is exposed from the package body 12 to electrically connect to the capacitor. As shown in FIG. 1A, the conductive layer 13 is physically in contact with the surface 16*al* of the conductive pillar 16*a* exposed from the package body 12, and the conductive layer 15 is physically in contact with the surface 16*b*1 of the conductive pillar 16*b* exposed from the package body 12. In some examples, the surface 16*b*1 of the conductive pillar 16*b* is substantially coplanar with the surface 121 of the package body 12.

In some examples, a dimension (or a length) of the conductive pillar 16*a* is different from a dimension (or a length) of the conductive pillar 16*b* in a direction along or parallel to a line normal to the surface 101 of the substrate 10. In some examples, the conductive pillar 16*a* is shorter than the conductive pillar 16*b* since the conductive pillar 16*a* is in contact with the bottommost conductive layer (e.g., conductive layer 13) of the capacitor while the conductive pillar 16*b* is in contact with another conductive layer of the capacitor.

Each of the conductive pillars 16*a* and 16*b* may include, for example, gold (Au), silver (Ag), copper (Cu), nickel (Ni), palladium (Pd), another metal(s) or alloy(s), or a combination of two or more thereof.

The capacitor (which may include the conductive layer 13, the dielectric layer 14, and the conductive layer 15) is disposed above the electronic component 11. For example, a line normal to the active surface of the electronic component 11 is along or parallel to a direction from the electronic component 11 to the capacitor. For example, a projective area of the conductive layer 13 (or the dielectric layer 14, or the conductive layer 15) on the substrate 10 overlaps with a projective area of the electronic component 11 on the substrate 10. The capacitor is spaced apart from the electronic component 11. For example, the capacitor is not in contact with the electronic component 11. For example, a portion of the package body 12 is disposed between the capacitor and the electronic component 11. The conductive layer 13 and the conductive layer 15 are electrically isolated or insulated from each other by the dielectric layer 14 disposed therebetween. The conductive layer 13 and the conductive layer 15 constitute two different electrodes of the capacitor which may be connected to power domain and ground domain respectively. In some embodiments as illustrated in FIG. 1D, the conductive layer 13 and the conductive layer 15 may each include multiple portions and form, for example, a comb-like electrode.

The capacitor is disposed above or on a top surface (e.g., 121) of the package body 12. In some examples, the capacitor is located in a cavity or a recess recessing from the surface 121 of the package body 12 and exposed from the package body 12. For example, the conductive layer 15 of the capacitor is exposed from the package body 12. For example, the conductive layer 15 of the capacitor is disposed above the surface 121 of the package body 12.

The conductive layer 13 may include any suitable materials. For examples, the conductive layer 13 may include, for example, titanium (Ti), Cu, Ni, another metal(s), or alloy(s) (such as a titanium-tungsten alloy (TiW)). In some examples, the conductive layer 13 may include a seed layer.

The dielectric layer 14 may include any suitable materials. For examples, the dielectric layer 14 may include, for example, an organic material, a solder mask, a polyimide (PI), an Ajinomoto build-up film (ABF), one or more molding compounds, one or more pre-impregnated composite fibers (e.g., a pre-preg material), a borophosphosilicate glass (BPSG), a silicon oxide, a silicon nitride, a silicon oxynitride, an undoped silicate glass (USG), any combination thereof, or the like. In some examples, the dielectric layer 14 may include, for example, an inorganic material, such as a silicon-oxide ($SiO_x$), a silicon-nitride ($SiN_x$), a tantalum oxide ($TaO_x$) or the like. In some examples, an interface between the package body 12 and the dielectric layer 14 can be observed. In some examples, the package body 12 and the dielectric layer 14 may include the same material and there is no interface between the package body 12 and the dielectric layer 14.

The conductive layer 15 may include any suitable materials. For examples, the conductive layer 15 may include, for example, Au, Ag, Al, Cu, chromium (Cr), tin (Sn), nickel (Ni) or stainless steel, or a mixture, an alloy, or other combination thereof.

In some examples, the conductive layer 15 may be conformally disposed on the surface 121 of the package body 12 and the surface 141 of the dielectric layer 14.

In some examples, the conductive layer 15 may be or include a shielding layer. In some examples in which the conductive layer 15 is or includes a shielding layer, the conductive layer 15 can be used to provide an electromagnetic interference (EMI) protection for the electronic component 11. For example, the conductive layer 15 may be connected to ground domain and be grounded through the substrate 10. In some embodiments, the conductive layer 15 may cover the sidewalls of the package body 12 and the sidewalls of the substrate 10 (as illustrated in FIG. 1D).

In some examples, the microstructure of the conductive layer 13 is different from the microstructure of the conductive layer 15. For example, the crystal structures, the grain sizes, or the other microstructures thereof can differentiate between the conductive layer 13 and the conductive layer 15.

The dielectric layer 14 is disposed between the conductive layer 13 and the conductive layer 15 in a cross sectional perspective. For example, a surface 141 of the dielectric layer 14 is in contact with the conductive layer 15 and a surface of the dielectric layer 14 opposite the surface 141 is in contact with the conductive layer 13.

Figure 2A:
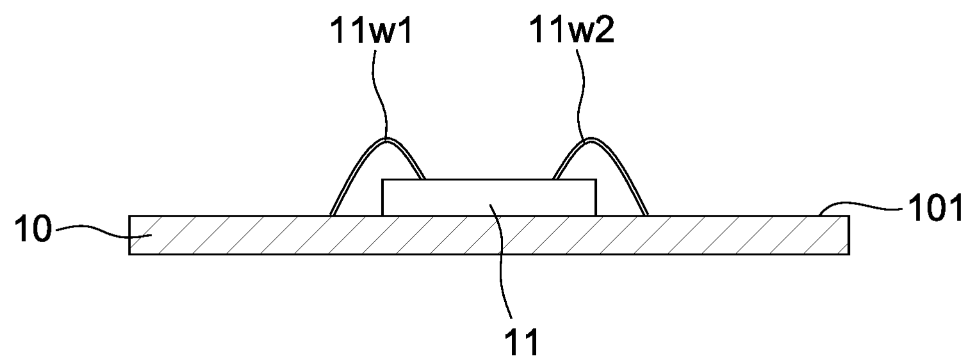
FIG. 2A to FIG. 2G illustrate various intermediate stages of an exemplary method for manufacturing a semiconductor device package in a cross sectional perspective, in accordance with some embodiments of the present disclosure.
Figure 2B:
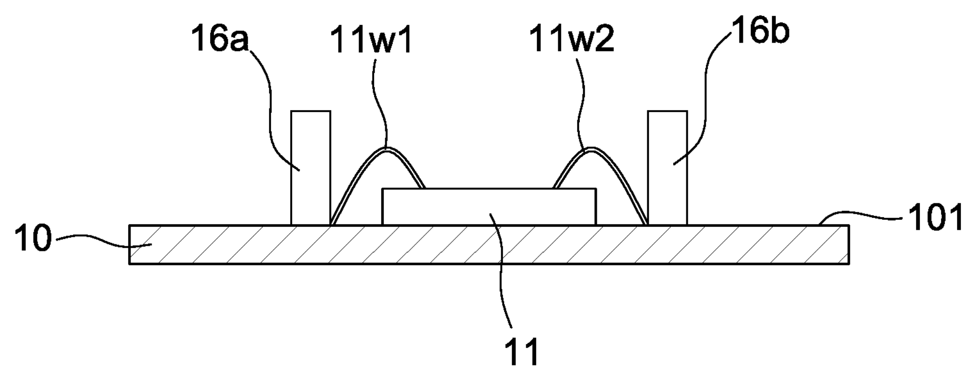
Figure 2C:
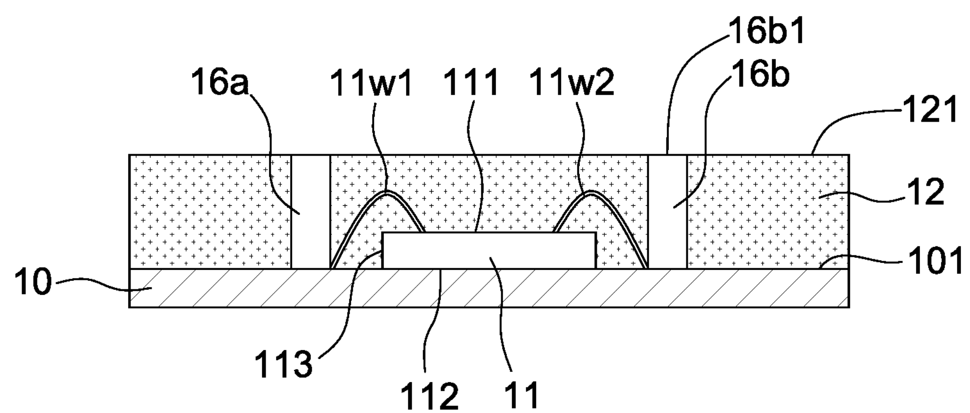
Figure 2D:
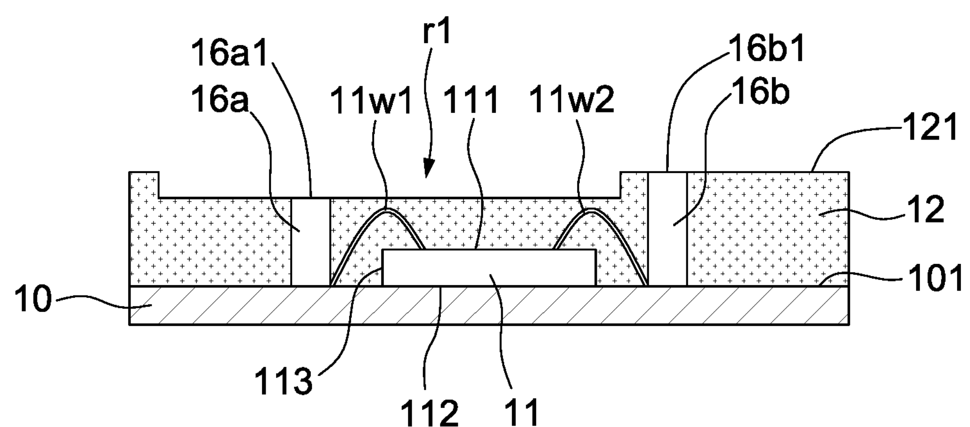
Figure 2E:
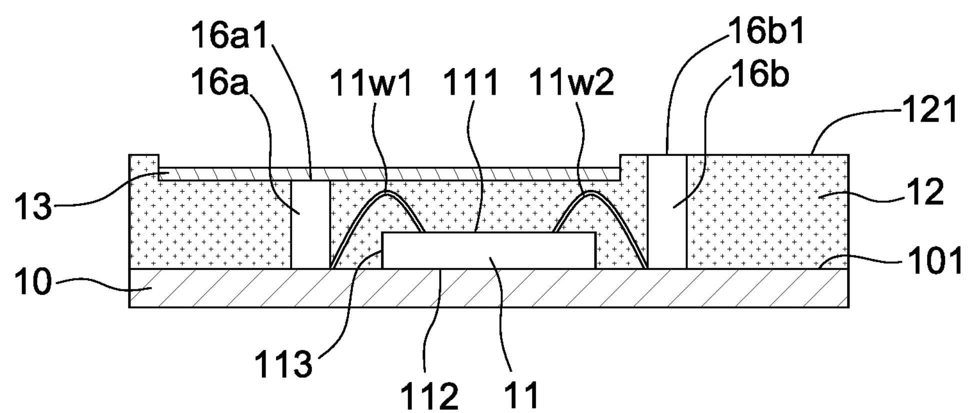
Figure 2F:
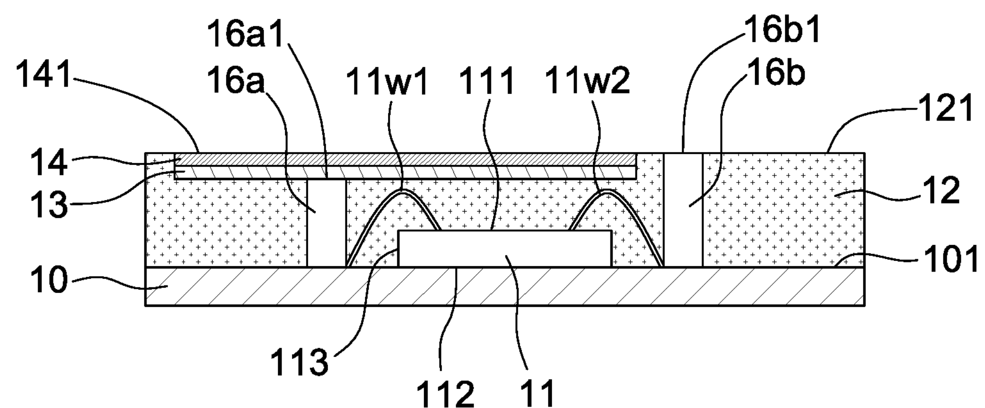
Figure 2G:
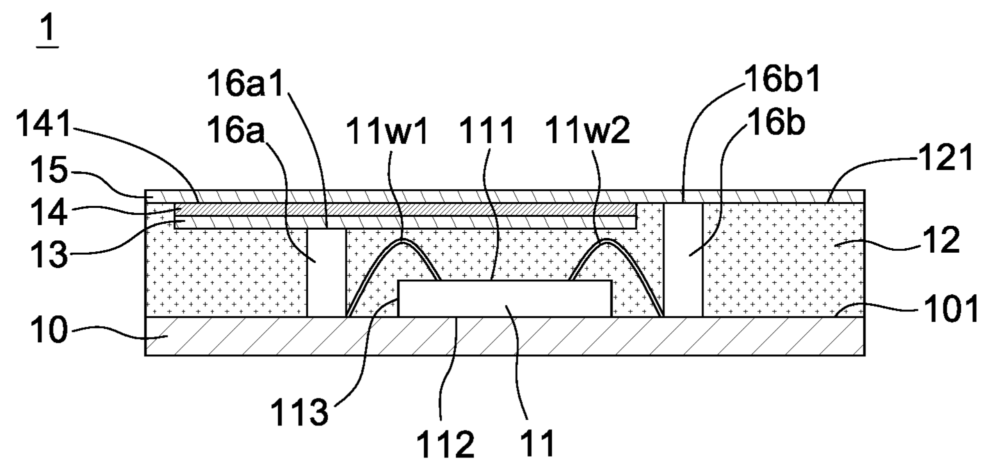

In an exemplary method for manufacturing the semiconductor device package 1, the conductive layer 13 and the dielectric layer 14 are formed in a cavity or a recess recessing from the surface 121 of the package body 12, and the conductive layer 15 is then disposed on the surface 121 of the package body 12 (such as operations illustrated in FIGS. 2E, 2F, and 2G). The cavity is spaced apart from the electronic component 11, and the conductive layer 13 and the dielectric layer 14 are accommodated in the cavity. As a result, the conductive layer 13 and the dielectric layer 14 may have substantially coplanar sidewalls.

In some exemplary methods in addition to or as an alternative to the aforesaid exemplary method, the surface 16*a*1 (or the top surface) of the conductive pillar 16*a* may be exposed from the cavity to contact the conductive layer 13, and the surface 16*b*1 (or the top surface) of the conductive pillar 16*b* may be exposed from the surface 121 of the package body 12 to contact the conductive layer 15. As a result, a bottom surface of the conductive layer 13 may be substantially coplanar with a surface of the package body 12 and the surface 16*al* of the conductive pillar 16*a*. Similarly, a bottom surface of the conductive layer 15 may be substantially coplanar with the surface 121 of the package body 12, the surface 16*b*1 of the conductive pillar 16*b*, and the surface 141 of the dielectric layer 14.

The capacitor is electrically connected to the electronic component 11 by one or more of the conductive pillars 16*a* and 16*b*, the conductive wires 11*w*1 and 11*w*2, and the substrate 10.

For example, in the embodiments illustrated in FIG. 1A, the conductive layer 13 is electrically connected to the electronic component 11 by the conductive pillar 16*a*, the one or more interconnection structures (e.g., a RDL) in the substrate 10, and the conductive wire 11*w*1. Similarly, the conductive layer 15 is electrically connected to the electronic component 11 by the conductive pillar 16*b*, the one or more interconnection structures (e.g., a RDL) in the substrate 10, and the conductive wire 11*w*2. In some examples, one of the conductive layer 13 and the conductive layer 15 may be connected to ground domain and another one may be connected to power domain based on the IC design of the electronic component 11.

In some embodiments, it is an object of the present disclosure to provide a structure and a method allowing a more accurate capacitance control of the decoupling capacitor. For examples, in some embodiments, the capacitor is formed or disposed in the cavity or recess of the package body 12 after the formation of the package body 12 covering the electronic component 11, the substrate 10 and the bonding wires connecting the electronic component 11 and the substrate 10 (referred to as "semi-product" hereinafter), so that the capacitance of the capacitor can be modified by taking the capacitance deviation, such as variation resulting from the manufacturing process, component position, wire length, and material characteristics, into consideration. For example, by comparing the capacitance of the semi-product with that of an Evaluation Board of a desired semiconductor device package, the capacitance of the capacitor can be determined more accurately and modified by adjusting the thickness and the surface area thereof. Hence, the capacitance deviation due to the manufacturing process, component position, wire length, and material characteristics, etc., may be alleviated or cancelled out, and a desired capacitance of a capacitor can be obtained as needed.

Figure 1B:
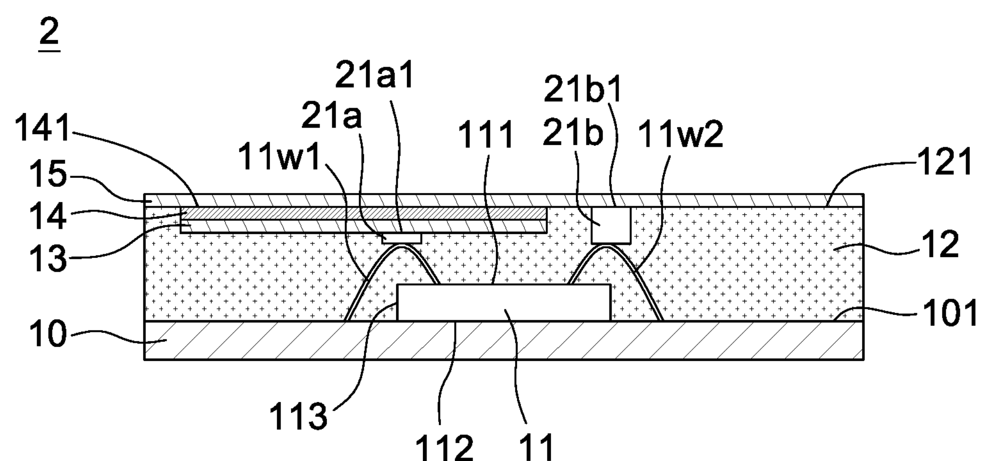
FIG. 1B illustrates a cross sectional view of an exemplary semiconductor device package in accordance with some embodiments of the present disclosure.

FIG. 1B illustrates a cross sectional view of an exemplary semiconductor device package 2 in accordance with some embodiments of the present disclosure.

As shown in FIG. 1B, the semiconductor device package 2 includes components such as, but not limited to, the substrate 10, the electronic component 11, the package body

12, and the capacitor including the conductive layer 13, the dielectric layer 14, the conductive layer 15, and the conductive wires 11*w*1 and 11*w*2, as shown and described with reference to the semiconductor device package 1, and those components are not repeated in the specification or designated with reference numerals for the sake of brevity and clarity.

The semiconductor device package 2 in FIG. 1B is similar to the semiconductor device package 1 in FIG. 1A except for the differences described below.

While the conductive pillars 16*a* and 16*b* penetrate from the surface 121 of the package body 12 to contact the substrate 10 of the semiconductor device package 1, the conductive pillars 21*a* and 21*b* of the semiconductor device package 2 as shown in FIG. 1B do not fully penetrate the package body 12 (i.e., they have an end located within the package body 12). The conductive pillars 21*a* and 21*b* are spaced apart from the substrate 10. In other words, the conductive pillars 21*a* and 21*b* are not in contact with the substrate 10. In some examples, a projective area of the conductive pillar 21*a* (or the conductive pillar 21*b*) on the substrate 10 overlaps with a projective area of the electronic component 11 on the substrate 10.

The capacitor of the semiconductor device package 2 is electrically connected to the electronic component 11 by one or more of the conductive pillars 21*a* and 21*b*, and the conductive wires 11*w*1 and 11*w*2.

The conductive pillar 21*a* is disposed between the capacitor (e.g., the conductive layer 13) and the electronic component 11. A part of the surface of the conductive pillar 21*a* facing the substrate 10 is physically in contact with the conductive wire 11*w*1. Similarly, the conductive pillar 21*b* is disposed between the capacitor (e.g., the conductive layer 15) and the electronic component 11. A part of the surface of the conductive pillar 21*b* facing the substrate 10 is physically in contact with the conductive wire 11*w*2.

Although the conductive pillars illustrated in FIGS. 1A and 1B have specific structures, the present disclosure is not limited thereto. For examples, the locations, dimensions, orientations, and number of the conductive pillars may be adjusted based on the design of the capacitor or other factors.

Figure 1C:
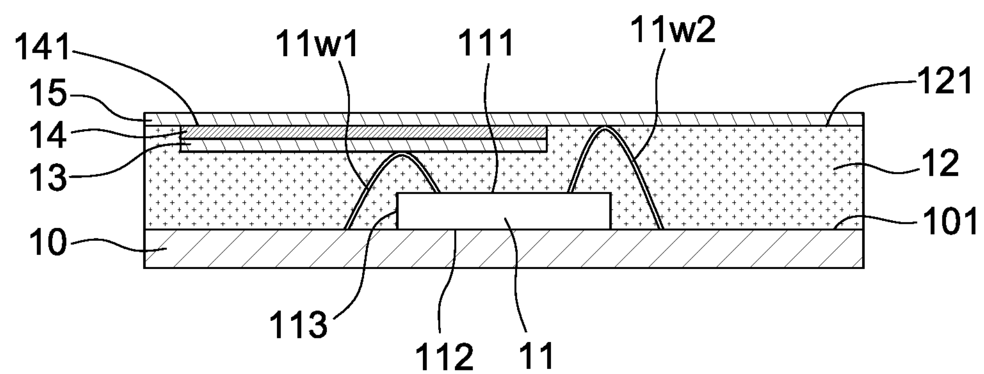
FIG. 1C illustrates a cross sectional view of an exemplary semiconductor device package in accordance with some embodiments of the present disclosure.
Figure 1D:
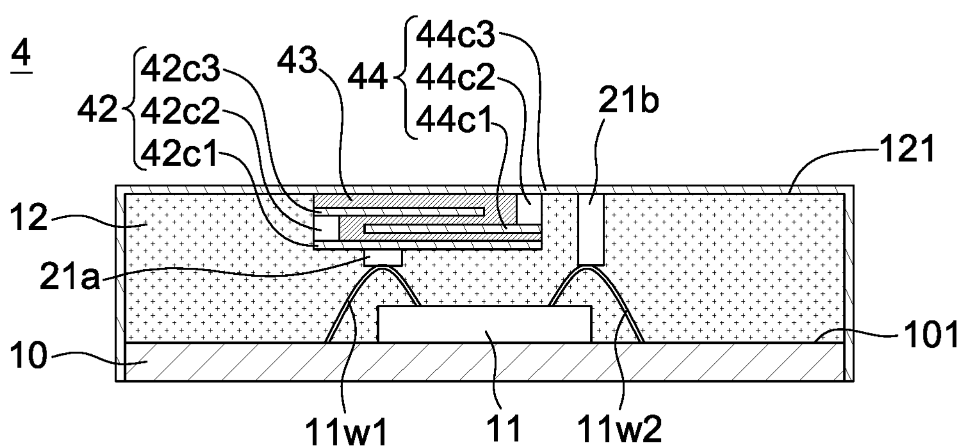
FIG. 1D illustrates a cross sectional view of an exemplary semiconductor device package in accordance with some embodiments of the present disclosure.

FIG. 1C illustrates a cross sectional view of an exemplary semiconductor device package 3 in accordance with some embodiments of the present disclosure.

The semiconductor device package 3 in FIG. 1C is similar to the semiconductor device packages 1 and 2 except that the capacitor of the semiconductor device package 3 is electrically connected to the electronic component 11 by the conductive wires 11*w*1 and 11*w*2. For example, the conductive layer 13 is physically in contact with the conductive wire 11*w*1, and the conductive layer 15 is physically in contact with the conductive wire 11*w*2.

In some examples, the top point of the conductive wire 11*w*1 is at an elevation lower than the top point of the conductive wire 11*w*2. For example, a perpendicular distance between the top point of the conductive wire 11*w*1 and the substrate 10 is shorter than a perpendicular distance between the top point of the conductive wire 11*w*2 and the substrate 10.

In comparison with the arrangement of the semiconductor device packages 1 and 2, the arrangement of the semiconductor device package 3 can further reduce manufacturing cost since the semiconductor device package 3 does not need the conductive pillars. On the other hand, the package body 12 of the semiconductor device packages 1 and 2 is ground or ablated to an elevation to expose the conductive pillars 16*a* and 16*b* to electrically connect to the capacitor while in the semiconductor device package 3 it is necessary to expose portions of the conductive wires 11*w*1 and 11*w*2 for electrical connection. The use of the conductive pillars enlarge the exposed surface area and thus the tolerance in the manufacturing process of the semiconductor device packages 1 and 2 is wider than that of the semiconductor device package 3.

FIG. 1D illustrates a cross sectional view of an exemplary semiconductor device package 4 in accordance with some embodiments of the present disclosure.

The semiconductor device package 4 in FIG. 1D is similar to the semiconductor device package 2 in FIG. 1B except for the differences described below.

The capacitor in the semiconductor device package 4 includes multiple portions, including a conductive layer 42 (corresponding to the conductive layer 13), a dielectric layer 43 (corresponding to the dielectric layer 14), and a conductive layer 44 (corresponding to the conductive layer 15) as shown.

In some embodiments, the conductive layer 42 includes multiple sub-portions, including two substantially parallel sub-layers 42*c*1, 42*c*3, and a via (or pillar or bump) 42*c*2 substantially perpendicular to the sublayers 42*c*1, 42*c*3 and electrically connecting with the sublayers 42*c*1, 42*c*3. The conductive layer 44 includes multiple sub-portions, including two substantially parallel sub-layers 44*c*1, 44*c*3, and a via (or pillar or bump) 44*c*2 substantially perpendicular to the sublayers 44*c*1, 44*c*3 and electrically connecting with the sublayers 42*c*1, 42*c*3. The dielectric layer 43 is disposed between the conductive layer 42 and the conductive layer 44. In some examples, the conductive layer 42 is electrically isolated or insulated from the conductive layer 44 by the dielectric layer 43.

Although the capacitors illustrated in FIGS. 1A, 1B, 1C and 1D have specific structures, the present disclosure is not limited thereto. For example, the locations, dimensions, orientations, and number of conductive layers and the dielectric layer thereof may be adjusted based on the design of the semiconductor device package and the desirable capacitance of the decoupling capacitor.

In addition, the conductive layer 44*c*3 may be or include a shielding layer. In some examples in which the conductive layer 44*c*3 is or include a shielding layer, the conductive layer 44*c*3 can be used to provide EMI protection for the electronic component 11. The conductive layer 44*c*3 covers the sidewalls of the package body 12 and the sidewalls of the substrate 10.

In some embodiments, the conductive pillars 21*a* and 21*b* of the semiconductor device package 4 in FIG. 1D may be replaced with the conductive pillars 16*a* and 16*b* as illustrated in FIG. 1A. In some embodiments, the semiconductor device package 4 does not include the conductive pillars 21*a* and 21*b* and is electrically connected to the electronic component by the conductive wires 11*w*1 and 11*w*2 as illustrated in FIG. 1C.

FIG. 2A to FIG. 2G illustrate various intermediate stages of an exemplary method for manufacturing a semiconductor device package in a cross sectional perspective, in accordance with some embodiments of the present disclosure. At least some of these figures have been simplified for a better understanding of the aspects of the present disclosure.

Referring to FIG. 2A, an electronic component 11 is disposed on the surface 101 of a substrate 10. In some examples, the electronic component 11 may be disposed on the substrate 10 by, for example, surface mounting techniques (SMT) or another suitable mechanism for mounting electronic components on a substrate. The electronic component 11 may be electrically connected to the substrate 10 by conductive wires 11*w*1 and 11*w*2. In some examples, one of the conductive wire 11*w*1 and the conductive wire 11*w*2 may be connected to ground domain and another one may be connected to power domain based on the IC design of the electronic component 11.

Referring to FIG. 2B, one or more conductive pillars (e.g., conductive pillars 16*a* and 16*b*) are disposed on the surface 101 of the substrate 10 and adjacent to the electronic component 11. The conductive pillars 16*a* and 16*b* are in physical contact with the conductive wires 11*w*1 and 11*w*2.

Referring to FIG. 2C, a package body 12 is disposed on the surface 101 of the substrate 10 to cover the conductive pillars 16*a* and 16*b* and the electronic component 11. In some examples, the package body may be formed by potting technique, dispensing technique, molding technique or another suitable technique. Afterward, a planarization operation (such as chemical mechanical planarization (CMP), an etching process, a laser ablation) or a grinding operation (such as through a grinding apparatus or other apparatus) may be performed to expose the surface 16*b*1 of the conductive pillar 16*b*, forming the package body 12 having a surface 121. In some examples, a surface of the conductive pillar 16*a* is also exposed from the surface 121 of the package body 12.

Referring to FIG. 2D, a recess r1 is recessed from the surface 121 of package body 12. In some examples, the recess r1 may be formed by performing a laser drilling, laser ablation, photoablation, or another suitable operation to form a recessing portion in a package body. A surface 16*al* of the conductive pillar 16*a* is exposed from the bottom of the recess r1.

In some examples, an electrical measurement may be conducted on the structure in the operation of FIG. 2C or FIG. 2D to determine a suitable capacitance of a capacitor to be formed in the recess. In some embodiments, the recess r1 may be formed or modified according to the predetermined capacitance. For example, one or more dimensions (including depth, width, length, and so on) of the recess r1 may be designed based on the predetermined capacitance.

Referring to FIG. 2E, a conductive layer 13 is disposed in the recess r1 in FIG. 2D to contact the surface 16*al* of the conductive pillar 16*a*. In some examples, the conductive layer 13 is accommodated in the recess r1 and covers the exposed portion of the conductive pillar 16*a*. In some examples, the conductive layer 13 may be formed by sputtering titanium and copper (Ti/Cu) or a titanium-tungsten alloy (TiW). In some embodiments, the conductive layer 13 may be formed by electroless plating of Ni or Cu.

Referring to FIG. 2F, a dielectric layer 14 is disposed in the recess r1 in FIG. 2D and on the conductive layer 13. In some examples, the dielectric layer 14 may be formed by, for example, coating, lamination or other suitable processes. In some examples, a surface 141 of the dielectric layer 14 may be substantially coplanar with the surface 121 of the package body 12.

Referring to FIG. 2G, a conductive layer 15 is disposed on the surface 141 of the dielectric layer 14 and the surface 121 of the package body 12. In some examples, the conductive layer 15 may be formed by, for example, a plating process. In some examples, the conductive layer 15 may be conformally disposed on the surface 141 of the dielectric layer 14 and the surface 121 of the package body 12. The final structure obtained from the operations of FIG. 2A, FIG. 2B, FIG. 2C, FIG. 2D, FIG. 2E, FIG. 2F, and FIG. 2G may be similar to the semiconductor device package 1 of FIG. 1A.

FIG. 3A to FIG. 3G illustrate various intermediate stages of an exemplary method for manufacturing a semiconductor device package in a cross sectional perspective, in accordance with some embodiments of the present disclosure. At least some of these figures have been simplified for a better understanding of the aspects of the present disclosure. The same or similar formations or operations of those components with the same reference numerals are not repeated for the sake of brevity and clarity.

Figure 3A:
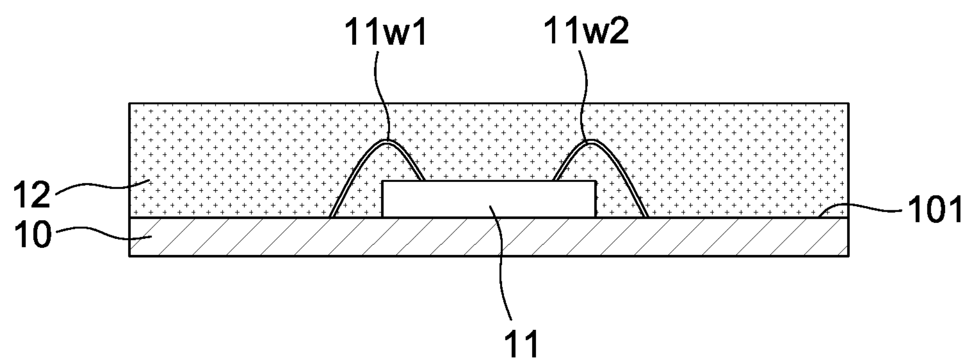
FIG. 3A to FIG. 3G illustrate various intermediate stages of an exemplary method for manufacturing a semiconductor device package in a cross sectional perspective, in accordance with some embodiments of the present disclosure.

Referring to FIG. 3A, which illustrates an operation subsequent to the operation of FIG. 2A, a package body 12 is disposed on the surface 101 of the substrate 10 to cover the electronic component 11 and the conductive wires 11*w*1 and 11*w*2.

Figure 3B:
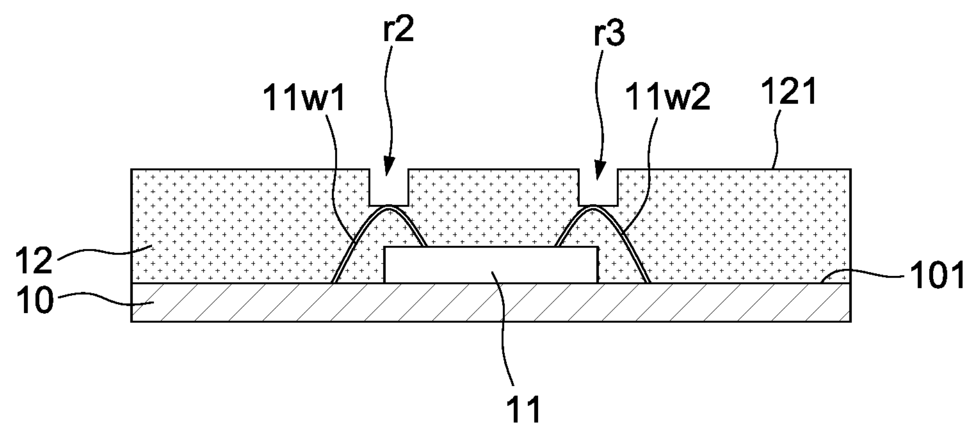

Referring to FIG. 3B, recesses r2 and r3 are recessed from the surface 121 of package body 12. The conductive wires 11*w*1 and 11*w*2 are exposed from the recesses r2 and r3.

Figure 3C:
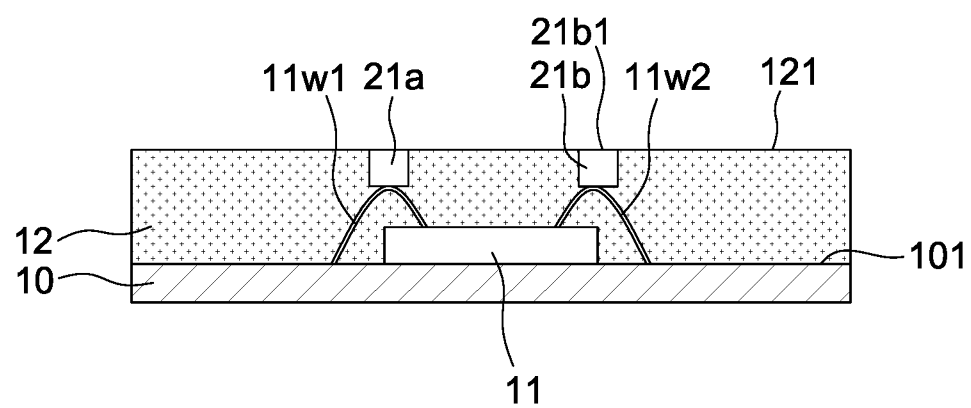

Referring to FIG. 3C, conductive pillars 21*a* and 21*b* are formed in the recesses r2 and r3 in FIG. 3B. In some embodiments, the conductive pillars 21*a* and 21*b* may be formed through an electroplating operation. For example, the conductive pillars 21*a* and 21*b* may be formed by plating of Cu, Ag, Ni, Au, or another metal. In some embodiments, the conductive pillars 21*a* and 21*b* may be formed by electroless plating of Cu, Ni, Pb, or another metal. In some embodiments, the conductive pillars 21*a* and 21*b* may be formed by printing Cu, Ag, Au, or another metal.

Figure 3D:
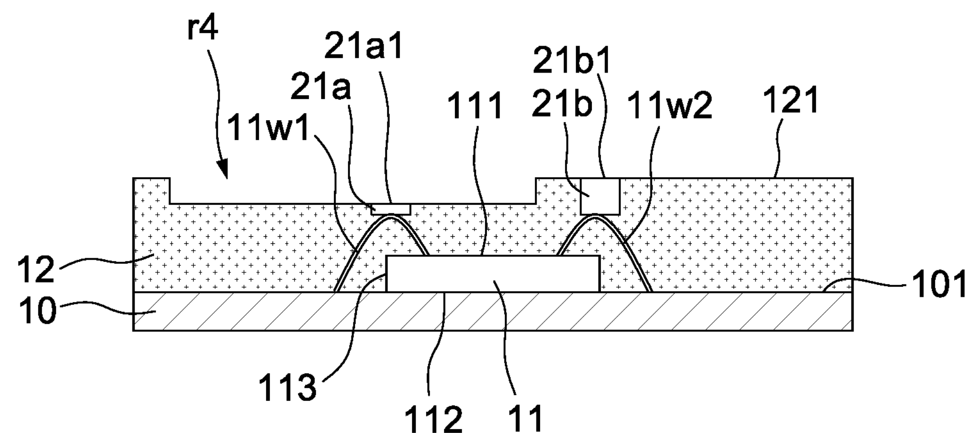

Referring to FIG. 3D, a recess r4 is recessed from the surface 121 of package body 12. A surface 21*al* of the conductive pillar 21*a* is exposed from the bottom of the recess r4. After the recess r4 is formed, the conductive pillar 21*a* may be shorter than the conductive pillar 21*b*.

In some examples, an electrical measurement may be conducted on the structure in the operation of FIG. 3C or FIG. 3D to determine a suitable capacitance of a capacitor to be formed in the recess r4. The recess r4 may be formed or modified according to the predetermined capacitance. For example, one or more dimensions (including depth, width, length, and so on) of the recess r4 may be designed based on the predetermined capacitance.

Figure 3E:
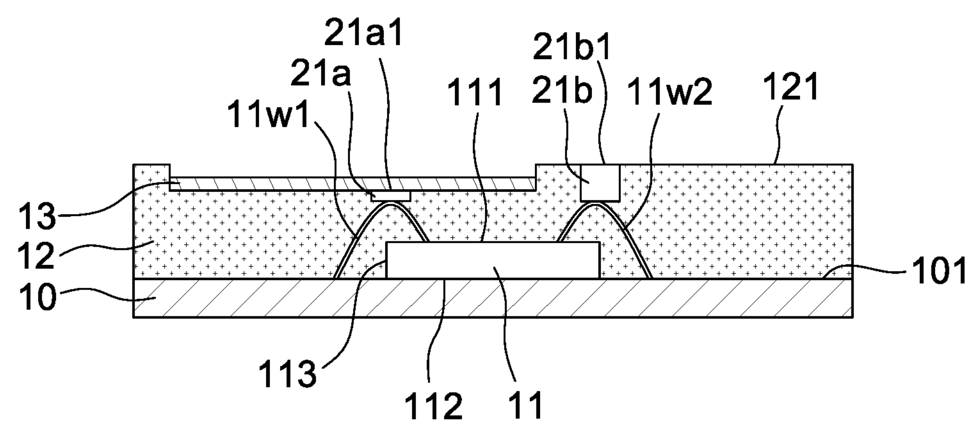

Referring to FIG. 3E, a conductive layer 13 is disposed in the recess r4 in FIG. 3D to contact the surface 21*a*1 of the conductive pillar 21*a*.

Figure 3F:
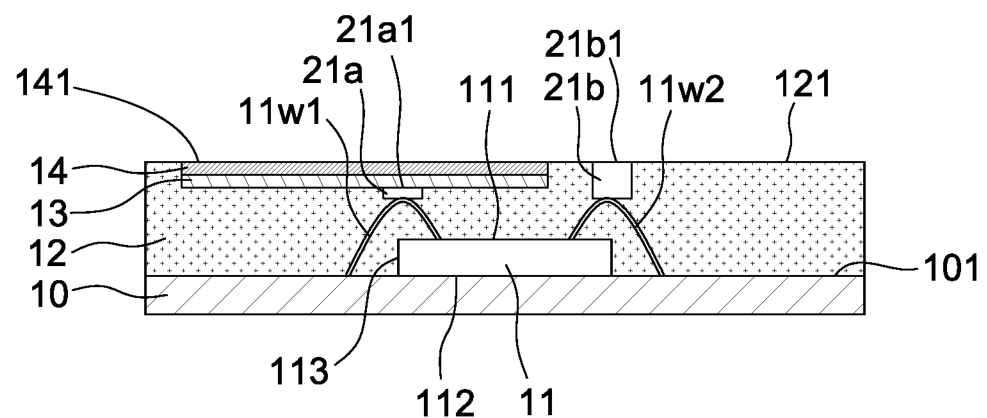

Referring to FIG. 3F, a dielectric layer 14 is disposed in the recess r4 in FIG. 3D and on the conductive layer 13. In some examples, a surface 141 of the dielectric layer 14 may be substantially coplanar with the surface 121 of the package body 12.

Figure 3G:
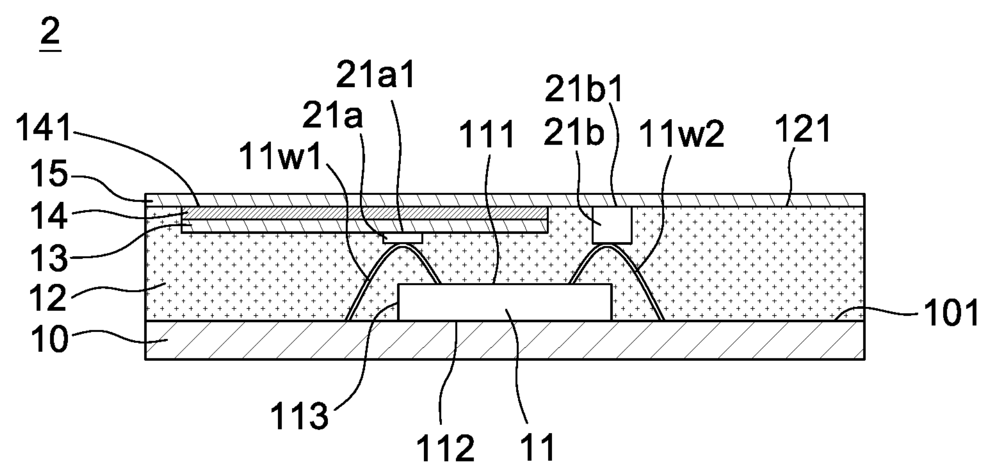

Referring to FIG. 3G, a conductive layer 15 is disposed on the surface 141 of the dielectric layer 14 and the surface 121 of the package body 12. The final structure obtained from the operations of FIG. 3A, FIG. 3B, FIG. 3C, FIG. 3D, FIG. 3E, FIG. 3F, and FIG. 3G may be similar to the semiconductor device package 2 of FIG. 1B.

FIGS. 4A to 4D illustrate various intermediate stages of an exemplary method for manufacturing a semiconductor device package in a cross sectional perspective, in accordance with some embodiments of the present disclosure. At least some of these figures have been simplified for a better understanding of the aspects of the present disclosure. The same or similar formations or operations of those components with the same reference numerals are not repeated for the sake of brevity and clarity.

Figure 4A:
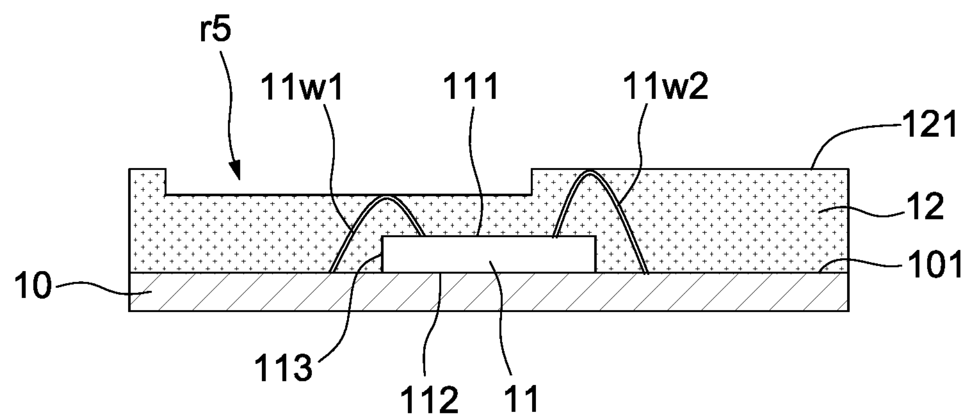
FIG. 4A to FIG. 4D illustrate various intermediate stages of an exemplary method for manufacturing a semiconductor device package in a cross sectional perspective, in accordance with some embodiments of the present disclosure.

FIG. 4A illustrates a structure similar to a structure obtained from the operation of FIG. 3A, except that the perpendicular distance between the top point of the conductive wire 11*w*1 and the substrate 10 is shorter than a perpendicular distance between the top point of the conductive wire 11*w*2 and the substrate 10. In some examples, the conductive wire 11*w*2 is exposed from the surface 121 of package body 12, and the conductive wire 11*w*1 is covered in the package body 12.

In FIG. 4A, a recess r5 is recessed from the surface 121 of package body 12, and the conductive wire 11*w*1 is exposed from the bottom of the recess r5.

In some examples, an electrical measurement may be conducted on the structure in the operation of FIG. 3A or FIG. 4A to determine a suitable capacitance of a capacitor to be formed in the recess r5. The recess r5 may be formed or modified according to the predetermined capacitance. For example, one or more dimensions (including depth, width, length, and so on) of the recess r5 may be designed based on the predetermined capacitance.

Figure 4B:
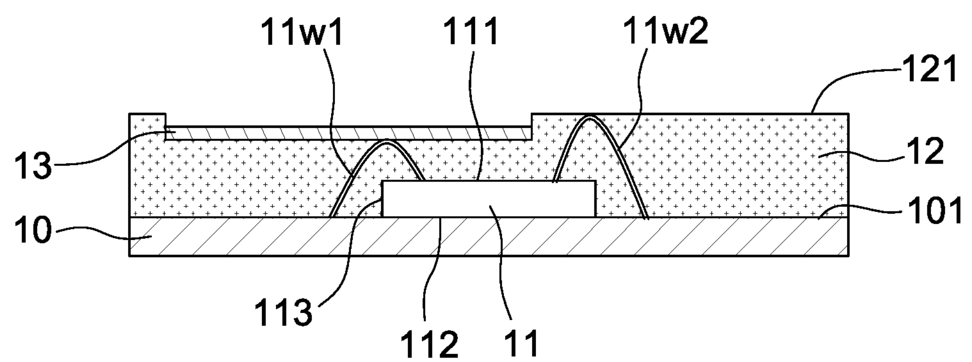

Referring to FIG. 4B, a conductive layer 13 is disposed in the recess r5 in FIG. 4A to contact the exposed portion of the conductive wire 11*w*1.

Figure 4C:
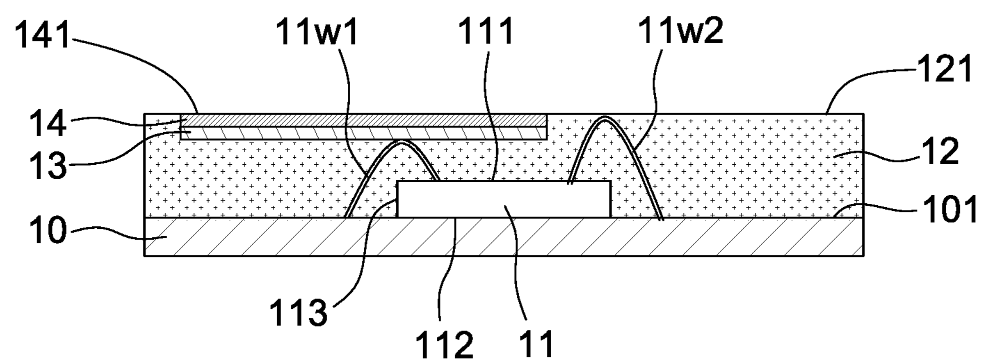

Referring to FIG. 4C, a dielectric layer 14 is disposed in the recess r5 in FIG. 4A and on the conductive layer 13.

Figure 4D:
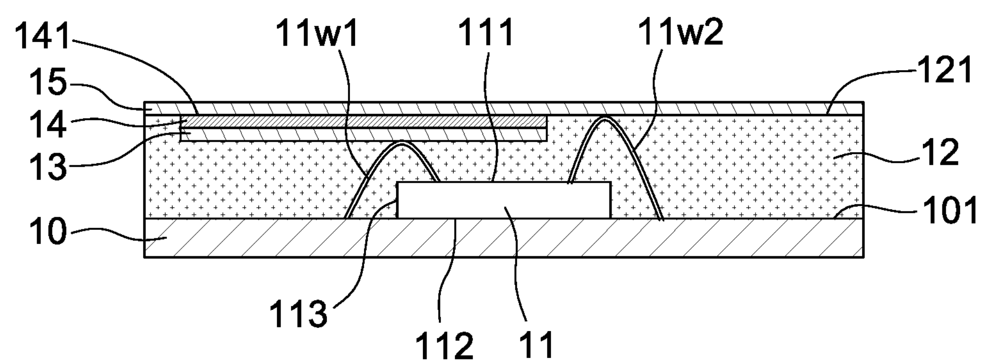

Referring to FIG. 4D, a conductive layer 15 is disposed on the surface 141 of the dielectric layer 14 and the surface 121 of the package body 12. The final structure obtained from the operations of FIG. 4A, FIG. 4B, FIG. 4C, and FIG. 4D may be similar to the semiconductor device package 3 of FIG. 1C.

FIGS. 5A to 5J illustrate various intermediate stages of an exemplary method for manufacturing a semiconductor device package in a cross sectional perspective, in accordance with some embodiments of the present disclosure. At least some of these figures have been simplified for a better understanding of the aspects of the present disclosure. The same or similar formations or operations of those components with the same reference numerals are not repeated for the sake of brevity and clarity.

Figure 5A:
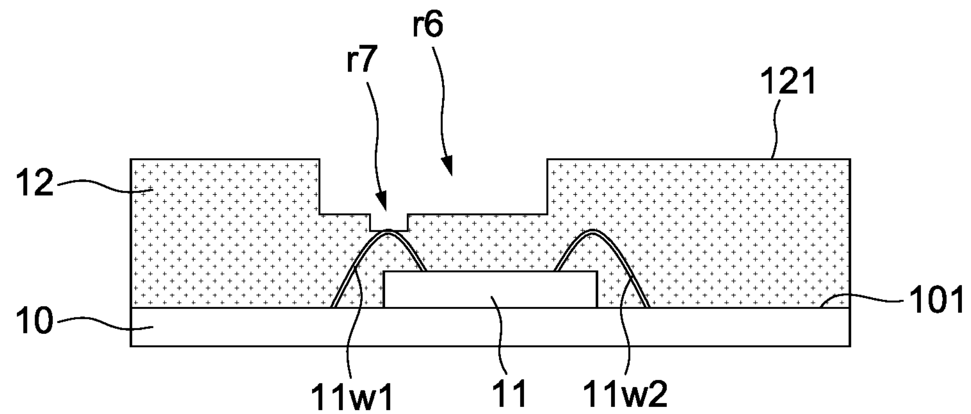
FIG. 5A to FIG. 5J illustrate various intermediate stages of an exemplary method for manufacturing a semiconductor device package in a cross sectional perspective, in accordance with some embodiments of the present disclosure.

Referring to FIG. 5A, which illustrates an operation subsequent to the operation of FIG. 3A, a recess r6 is recessed from the surface 121 of package body 12. A recess r7 is further recessed from the bottom of the recess r6. In a direction substantially parallel to the surface 101 of the substrate 10, a dimension (e.g., width) of the recess r6 is greater than that of the recess r7. The conductive wire 11*w*1 is exposed from the bottom of the recess r7.

Figure 5B:
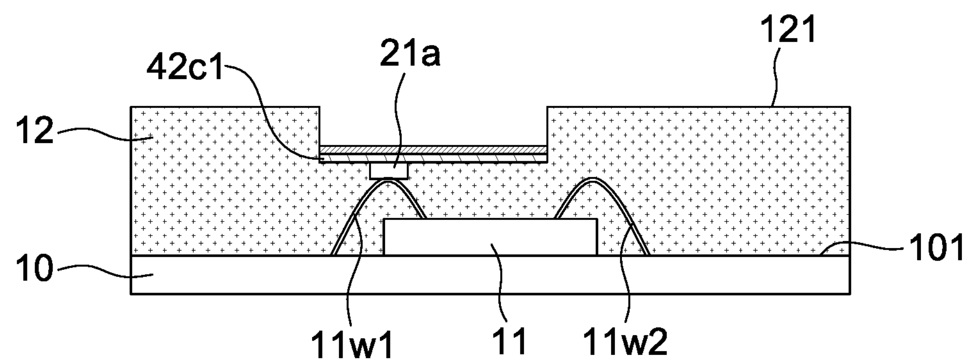

In some examples, an electrical measurement may be conducted on the structure in the operation of FIG. 3A or FIG. 5B (after the formation of conductive pillar 21*a*) to determine a suitable capacitance of a capacitor to be formed in the recess r6. to obtain the capacitance deviation and to calculate a predetermined capacitance. The recess r6 may be formed or modified according to the predetermined capacitance. For example, one or more dimensions (including depth, width, length, and so on) of the recess r6 may be designed based on the predetermined capacitance.

Referring to FIG. 5B, a conductive pillar 21*a* is formed in the recess r7 in FIG. 5A to contact the exposed portion of the conductive wire 11*w*1. In addition, a conductive sub-layer 42*c*1 is disposed in the recess r6 in FIG. 5A to contact the exposed portion of the conductive pillar 21*a*.

Figure 5C:
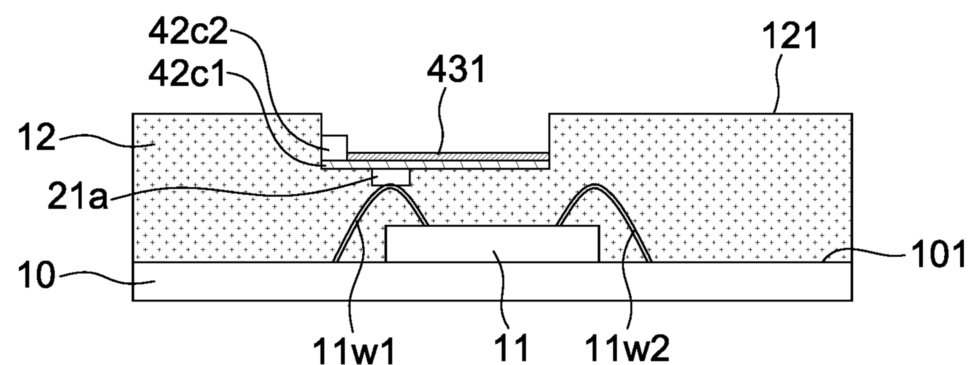

Referring to FIG. 5C, a conductive pillar or bump 42*c*2 (which may include, for example, but not limited to, a pre-formed conductive pillar or bump) is disposed in the recess r6 in FIG. 5A and on the sub-layer 42*c*1. A portion of the sub-layer 42*c*1 is exposed from the conductive pillar or bump 42*c*2. In addition, a dielectric layer 431 is disposed in the recess r6 in FIG. 5A and on the exposed portion of the sub-layer 42*c*1.

Figure 5D:
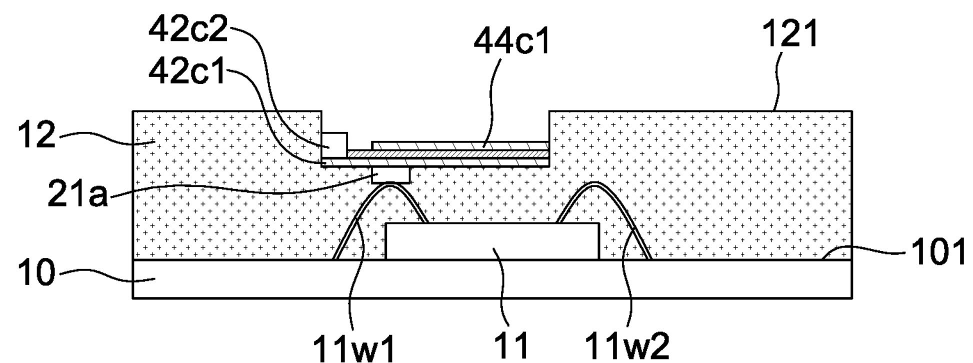

Referring to FIG. 5D, a conductive sub-layer 44*c*1 is disposed in the recess r6 in FIG. 5A and on the dielectric layer 431. A portion of the dielectric layer 431 is exposed from the conductive sub-layer 44*c*1.

Figure 5E:
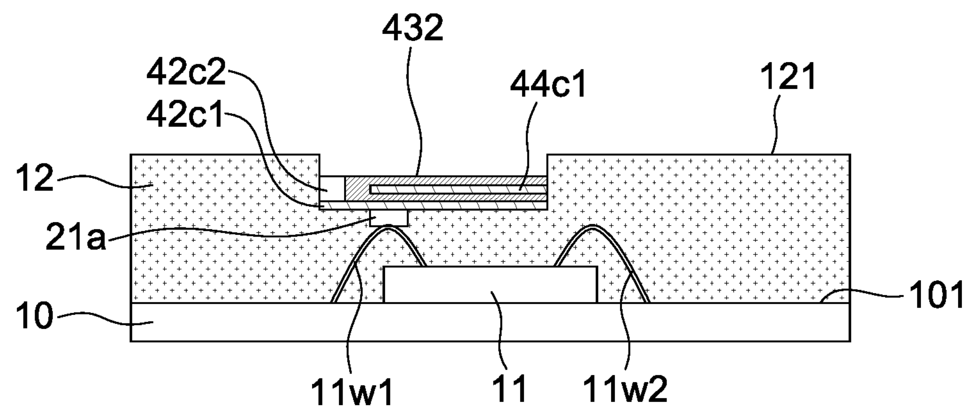

Referring to FIG. 5E, a dielectric layer 432 is disposed in the recess r6 in FIG. 5A and on the conductive sub-layer 44*c*1 and the exposed portion of the dielectric layer 431. A top surface of the conductive via 42*c*2 is exposed from the dielectric layer 432.

Figure 5F:
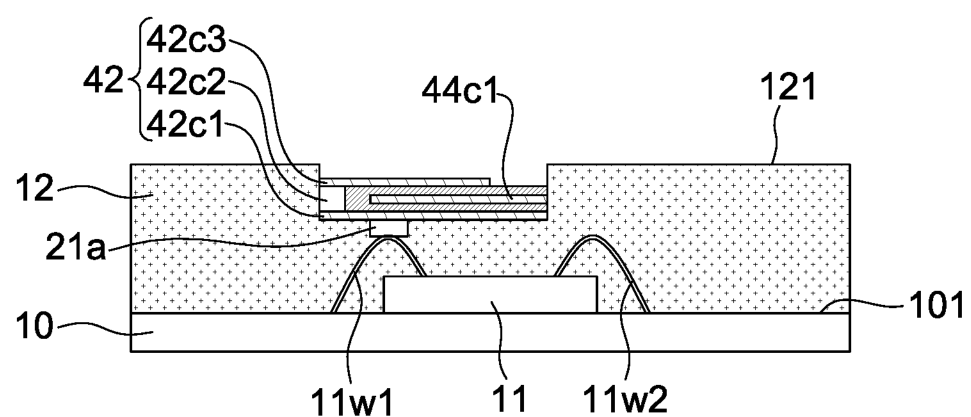

Referring to FIG. 5F, a conductive sub-layer 42*c*3 is disposed in the recess r6 in FIG. 5A and on the top surface of the conductive via 42*c*2 and the dielectric layer 432. A portion of the dielectric layer 432 is exposed from the conductive sub-layer 42*c*3.

Figure 5G:
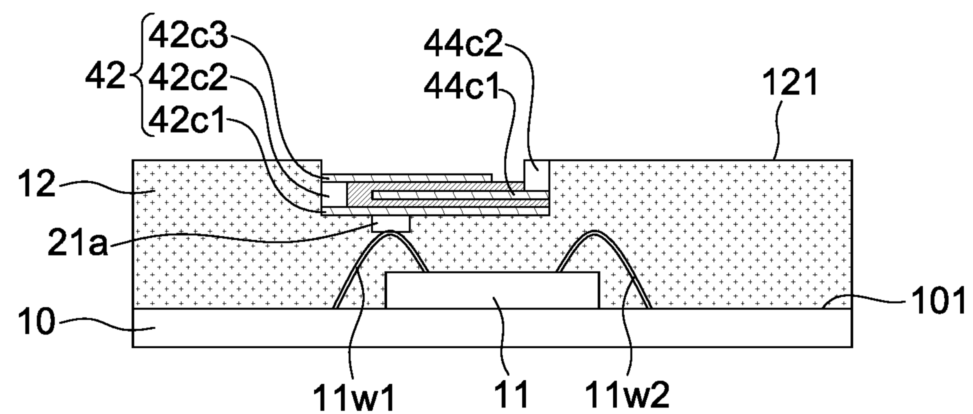

Referring to FIG. 5G, a portion of the dielectric layer 432 is removed to expose a portion of the conductive sub-layer 44*c*1. In addition, a conductive pillar or bump 44*c*2 (which may include, for example, but not limited to, a pre-formed conductive pillar or bump) is disposed on the exposed portion of the conductive sub-layer 44*c*1.

Figure 5H:
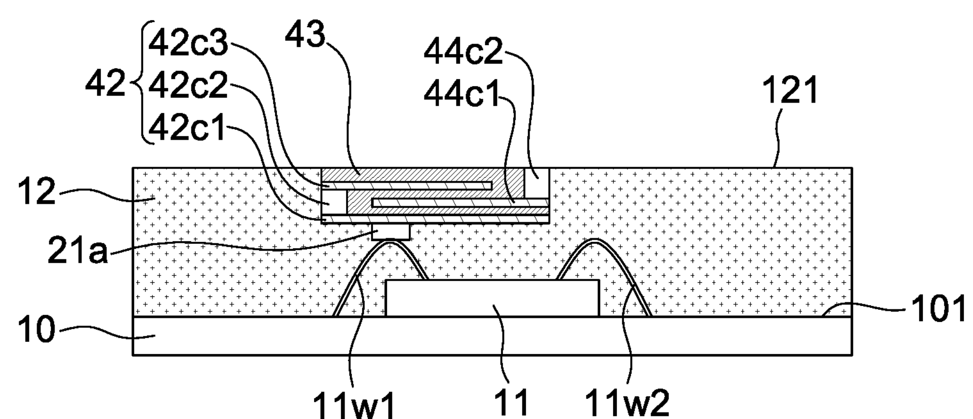

Referring to FIG. 5H, a dielectric layer is disposed in the recess r6 in FIG. 5A and on the conductive sub-layer 42*c*3 and the exposed portion of the dielectric layer 432. The dielectric layers 431, 432, and the dielectric layer formed in the operation of FIG. 5H are together referred to the dielectric layer 43. In some examples, a top surface of the dielectric layer 43 may be substantially coplanar with the surface 121 of the package body 12.

Figure 5I:
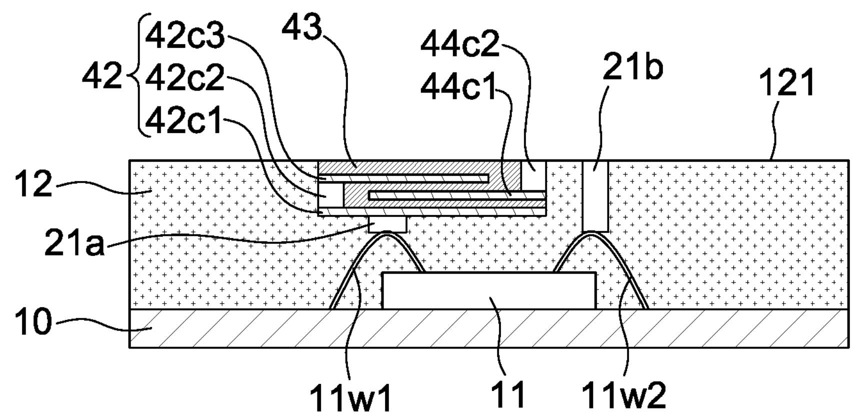

Referring to FIG. 5I, a portion of the package body 12 is removed to expose the conductive wire 11*w*2, and a conductive pillar 21*b* is disposed in the package body 12 to contact the conductive wire 11*w*2.

Figure 5J:
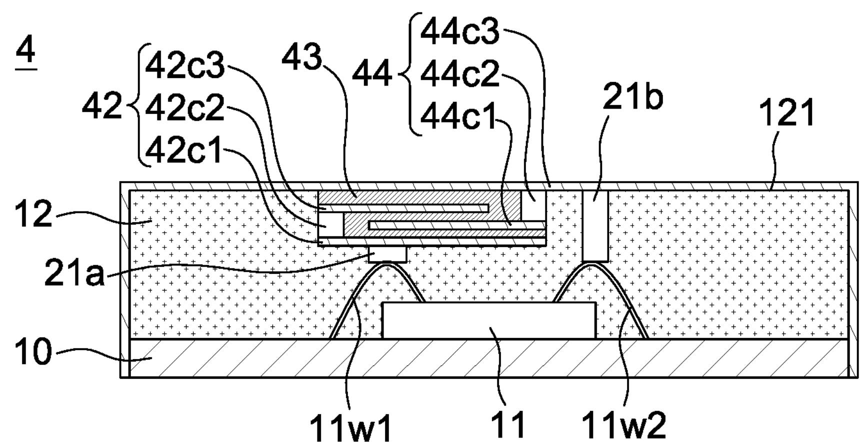

Referring to FIG. 5J, a conductive sub-layer 44*c*3 is disposed on the top surface of the dielectric layer 14 and the surface 121 of the package body 12. The final structure obtained from the operations of FIG. 5A, FIG. 5B, FIG. 5C, FIG. 5D, FIG. 5E, FIG. 5F, FIG. 5G, FIG. 5I, and FIG. 5J may be similar to the semiconductor device package 4 of FIG. 1D.

In some embodiments, the conductive pillar or bump 42*c*2 and 44*c*2 may be conductive vias which are in-situ formed in the dielectric layer 43. For example, after the formation of the conductive pillar 21*a* as shown in FIG. 5B, the conductive sub-layer 42*c*1, dielectric layer 431, the conductive sub-layer 44*c*1 and the dielectric layer 432 can be disposed in the recess r6 in FIG. 5A sequentially and then an opening may be formed in the dielectric layer 432 by a laser drilling, laser ablation, photoablation, or another suitable operation. A portion of the sub-layer 42*c*1 may be exposed from the opening. Then, the conductive via 42*c*2 may be formed in the opening and disposed on the sub-layer 42*c*1 as shown in FIG. 5E. In some embodiments, the conductive via 42*c*2 is formed through an electroplating operation. For examples, the conductive via 42*c*2 may be formed by plating Cu, Ag, Ni, Au, or another metal. In some embodiments, the conductive via 42*c*2 may be formed by electroless plating Cu, Ni, Pb, or another metal. In some embodiments, the conductive via 42*c*2 may be formed by printing Cu, Ag, Au, or another metal. In some embodiments, a seed layer may be disposed on the exposed surface of the sub-layer 42*c*1 and the side surface of the opening. In some embodiments, the seed layer may be formed by sputtering titanium and copper (Ti/Cu) or a titanium-tungsten alloy (TiW). In some embodiments, the seed layer may be formed by electroless plating Ni or Cu.

Similarly, after the formation of the dielectric layer 43 as shown in FIG. 5H, an opening may be formed in the dielectric layer 43 by a laser drilling, laser ablation, photoablation, or another suitable operation. A portion of the sub-layer 44*c*1 may be exposed from the opening. Then, the conductive via 44*c*2 may be formed in the opening and disposed on the sub-layer 44*c*1 as shown in FIG. 5H. In some embodiments, the conductive via 44*c*2 is formed through an electroplating operation. For examples, the conductive via 44*c*2 may be formed by plating Cu, Ag, Ni, Au, or another metal. In some embodiments, the conductive via 44*c*2 may be formed by electroless plating Cu, Ni, Pb, or another metal. In some embodiments, the conductive via 44*c*2 may be formed by printing Cu, Ag, Au, or another metal. In some embodiments, a seed layer may be disposed on the exposed surface of the sub-layer 44*c*1 and the side surface of the opening. In some embodiments, the seed layer may be formed by sputtering titanium and copper (Ti/Cu) or a titanium-tungsten alloy (TiW). In some embodiments, the seed layer may be formed by electroless plating Ni or Cu.

In some embodiments, the capacitor may be in-situ formed. In some other embodiments, the capacitor may be pre-formed and then placed into the cavity or recess of the package body 12; in such case, the outmost conductive layer (e.g., 15, 44*c*3) of the capacitor may be formed after the placement of the pre-formed structure.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within +10%, ±5%, +1%, or +0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (m) of lying along the same plane, such as within 10 m, within 5 m, within 1 m, or within 0.5 m of lying along the same plane. When referring to numerical values or characteristics as "substantially" the same, the term can refer to the values lying within ±10%, ±5%, ±1%, or +0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:

a substrate;

an electronic component disposed on the substrate;

a package body disposed on the substrate and encapsulating the electronic component; and a capacitor disposed above the electronic component;

wherein the capacitor is exposed from the package body;

wherein the capacitor comprises a first conductive layer, a second conductive layer above the first conductive layer, and a dielectric layer between the first conductive layer and the second conductive layer; and wherein the second conductive layer is electrically connected to the electronic component through a first conductive pillar disposed over the substrate and spaced apart from the electronic component.

2. The semiconductor device package as claimed in claim 1, wherein a portion of the package body is disposed between the capacitor and the electronic component.

3. The semiconductor device package as claimed in claim 1, wherein the first conductive layer is electrically connected to the electronic component through a second conductive pillar disposed over the substrate and spaced apart from the electronic component.

4. The semiconductor device package as claimed in claim/wherein the second conductive pillar is disposed between the first conductive layer and the substrate.

5. The semiconductor device package as claimed in claim 1, wherein the second conductive layer comprises a shielding layer.

6. The semiconductor device package as claimed in claim 1, wherein a projective area of the second conductive layer on the substrate is overlapped with a projective area of the electronic component on the substrate.

7. The semiconductor device package as claimed in claim 1, wherein the first conductive pillar has a surface substantially coplanar with a top surface of the package body.

8. The semiconductor device package as claimed in claim 1, wherein the first conductive pillar has a surface substantially coplanar with a surface of the dielectric layer.

9. The semiconductor device package as claimed in claim 1, wherein the first conductive layer is electrically connected to the electronic component through a first conductive wire.

10. The semiconductor device package as claimed in claim 9, wherein the first conductive layer is physically in contact with the first conductive wire.

11. A semiconductor device package, comprising:

a substrate;

an electronic component disposed on the substrate;

a package body disposed on the substrate and encapsulating the electronic component; and a capacitor disposed above the electronic component;

wherein the capacitor is exposed from the package body;

wherein the capacitor comprises a first conductive layer, a second conductive layer above the first conductive layer, and a dielectric layer between the first conductive layer and the second conductive layer;

wherein the first conductive layer is electrically connected to the electronic component through a conductive wire;

wherein the first conductive layer is physically in contact with the conductive wire.

* * * * *